United States Patent [19]

Bergemont

[11] Patent Number: 5,091,327
[45] Date of Patent: Feb. 25, 1992

[54] FABRICATION OF A HIGH DENSITY STACKED GATE EPROM SPLIT CELL WITH BIT LINE REACH-THROUGH AND INTERRUPTION IMMUNITY

[75] Inventor: Albert M. Bergemont, Santa Clara, Calif.

[73] Assignee: National Semiconductor Corporation, Santa Clara, Calif.

[21] Appl. No.: 545,396

[22] Filed: Jun. 28, 1990

[51] Int. Cl.[5] .......................................... H01L 21/76
[52] U.S. Cl. ...................................... 437/43; 437/49; 437/195; 437/979
[58] Field of Search ....................... 437/43, 195, 49, 52, 437/48, 979; 357/23.5; 148/DIG. 50, DIG. 163

[56] References Cited

U.S. PATENT DOCUMENTS

| | | | |
|---|---|---|---|
| 4,616,402 | 10/1986 | Mori | 437/52 |
| 4,639,893 | 1/1987 | Eitan | |
| 4,698,900 | 10/1987 | Esquivel | 148/DIG. 50 |
| 4,795,719 | 1/1989 | Eitan | 437/52 |
| 4,892,840 | 1/1990 | Esquivel et al. | 437/48 |

OTHER PUBLICATIONS

IEEE Cir. Conf., 2/77, Salsbury et al.
VLSI Cir. Conf., 1989, Ali et al.

*Primary Examiner*—Brian E. Hearn
*Assistant Examiner*—C. Chaudhari
*Attorney, Agent, or Firm*—Limbach, Limbach & Sutton

[57] ABSTRACT

A method for fabricating a split-gate EPROM cell utilizing stacked etch techniques is provided. In accordance with a preferred embodiment of the method, a layer of silicon dioxide is formed on a P— silicon substrate. A layer of polysilicon is formed on the silicon dioxide layer, followed by growth of an oxide/nitride/oxide (ONO) layer. The ONO and polysilicon layers are etched to define floating gates. Next, an edge of each floating gate is utilized in a self-aligned implant of buried N+ bit lines. The floating gate extends only over a first portion of the channel defined between the adjacent buried bit lines. A differential oxide layer is grown on the substrate between adjacent floating gates in a low temperature steam oxidation step. That is, the oxide formed over the exposed portion of the buried N+ bit line is thicker than the oxide formed over the exposed portion of the channel. Following formation of the differential oxide layer, a second layer of polysilicon is formed and etched to define control lines extending perpendicular to the floating gates in the conventional split-gate EPROM cell structure. The control gates are utilized in a stacked etch to complete the split-gate cells. The etch is carried out such that the oxide overlying the N+ bit lines protect the surface of the substrate, avoiding bit line interruption, while the silicon dioxide overlying the exposed portion of the channel is overetched to form a trench into the channel that extends below the junction depth of the N+ region, thereby eliminating bit line to bit line reach-through.

5 Claims, 2 Drawing Sheets

FABRICATION OF A HIGH DENSITY STACKED GATE EPROM SPLIT CELL WITH BIT LINE REACH-THROUGH AND INTERRUPTION IMMUNITY

BACKGROUND OF THE INVENTION

1. The Field of the Invention

The present invention relates to split-gate memory cells of the type utilizable in an erasable programmable read-only memory (EPROM) and, more particularly, to a split-gate memory cell that is fabricated utilizing stacked etch techniques, but which is immune to bit line interruption and bit line to bit line reach-through.

2. Discussion of the Prior Art

FIG. 1A shows a conventional stacked gate EPROM cell 10. The EPROM cell 10 includes a buried N+ source region 12 and a buried N+ drain region 14 formed in a P− silicon substrate 16 and separated by a substrate channel region 18. Overlying channel region 18 is a layer of insulating material 20, typically silicon dioxide. A floating gate 22 is formed on the insulating material 20. Typically, floating gate 22 is formed of polycrystalline silicon. Overlying floating gate 22 is a second layer 24 of insulating material, typically a composite of oxide/nitride/oxide (ONO). A control gate 26 is formed on the ONO layer 24. Typically, the control gate 26 is also formed of polycrystalline silicon.

A plan view of the stacked gate EPROM cell 10 is shown in FIG. 1B. The structure of the cell 10 derives its "stacked-gate" designation because of the self-aligned etching process which is utilized to form the vertically-aligned control gate line 26 and floating gate 22 of the cell 10.

The processing sequence for forming the polysilicon floating gate 22 and the polysilicon control line 26 of the stacked gate cell 10 is as follows. Referring to FIG. 1A, first, a layer of polysilicon is formed on the intermediate layer of silicon dioxide 20. The polysilicon layer and the underlying oxide 20 are then masked and etched to define the floating gate 22. The edges of the floating gate 22 are then utilized in a self-aligned implant step to form the buried N+ source and drain regions 12 and 14, respectively. Next, an ONO layer is grown over the entire structure. This is followed by growth of a second polysilicon layer from which the control gate line 26 will be formed. The second polysilicon layer is then masked and etched. The resulting control gate line 26 is then used as a self-aligned mask to etch the interpoly ONO 24 and the underlying floating gate 22 to define the final structure of the stacked gate cell 10 shown in FIG. 1A.

More recently, split-gate EPROM cells have been proposed as a means for improving on the packing density and yield of the above-described stacked gate EPROM cell.

U.S. Pat. No. 4,639,893, issued Jan. 27, 1987 to Boaz Eitan discloses an implementation of a split-gate EPROM cell. Referring to FIG. 2A, the split-gate memory cell 30 disclosed by Eitan is formed by a process which self-aligns the drain region 32 to an edge of the floating gate 34. The floating gate 34 extends only over a first section 35 of the channel region 36 between the drain region 32 and the source region 38, thereby defining a second section 37 of the channel region between the floating gate 34 and the source region 38. The control gate line 40 is formed over the floating gate 34 and also controls the second section 37 of the channel region 36 to provide split-gate operation. The source region 38 is formed sufficiently far from the floating gate 34 so that the second section 37 of the channel region is controlled by the control gate 40, but does not have to be accurately defined.

With improvements in integrated circuit processing technology, the length of the channel region 36 may be reduced dramatically. One way to reduce the cell size is to use the stacked etch techniques described above with respect to the stacked gate cell 10. However, utilization of a stacked etch process for fabricating split-gate cells has two significant drawbacks. First, referring to the FIG. 2B plan view of the split-gate cell 30, because in the split-gate structure the poly 2 control lines and the poly 1 floating gates are perpendicular to one another, a stacked etch of the poly 2 and poly 1 layers can result in digging into the buried N+ regions between adjacent control lines, i.e. regions (1) in FIG. 2, because of the insufficient thickness of the gate oxide overlying these regions. Furthermore, as the distance between the adjacent buried N+ regions is reduced, the potential for reach-through from the N+ source region 38 to the N+ drain region 32 in the channel region between adjacent control lines, i.e. region (2) in FIG. 2B, also increases.

It would, therefore, be desirable to have available a method that utilizes stacked etch techniques for fabricating a split-gate EPROM cell, but which does not cause bit line interruption and which prevents bit line to bit line reach-through.

SUMMARY OF THE INVENTION

The present invention provides a method of fabricating a split-gate memory cell array utilizing stacked etch techniques.

In accordance with a preferred embodiment of the method, a layer of silicon dioxide is formed on a P− silicon substrate. A layer of polysilicon is then formed on the silicon dioxide layer, followed by the growth of an overlying oxide/nitride/oxide (ONO) layer. These layers are then etched to define the floating gates of the cell array. Next, an edge of each floating gate is utilized in a self-aligned implant to form the array's buried N+ bit lines. Each cell's floating gate extents only over a portion of the channel region in the conventional split-gate cell manner. In accordance with the present invention, a differential oxide layer is then grown on the silicon substrate between adjacent floating gates. That is, the oxide formed over the exposed portions of the buried N+ bit lines is thicker than the oxide that is formed over the exposed portion of the channel region. Following formation of the differential oxide layer, a second layer of polysilicon is formed over the entire structure such that the floating gates are separated from the second polysilicon layer by the ONO. The second polysilicon layer is then etched to define parallel control lines that extend perpendicular to the floating gates, resulting in the definition of split-gate cells. Next, the control gates are utilized in a stacked etch of the underlying layers. The stacked etch is carried out such that the oxide overlying the buried N+ bit lines protects the bit lines while the oxide overlying the exposed portion of the channel region is overetched to form a trench that extends into the channel region between adjacent control lines to below the junction depth of the buried N+ bit lines.

Thus, incorporation of the differential oxide step as described above allows stacked etch fabrication techniques to be utilized in fabricating a split-gate EPROM cell without incurring bit line interruption as a result of the stacked etch. Also, formation of the trench between the buried N+ bit lines in the region between adjacent control lines prevents bit line to bit line reach-through.

A better understanding of the features and advantages of the present invention will be obtained by reference to the following detailed description of the invention and accompanying drawings which set forth illustrative embodiments in which the principles of the invention are utilized.

DETAILED DESCRIPTION OF THE INVENTION

Figure 3A:
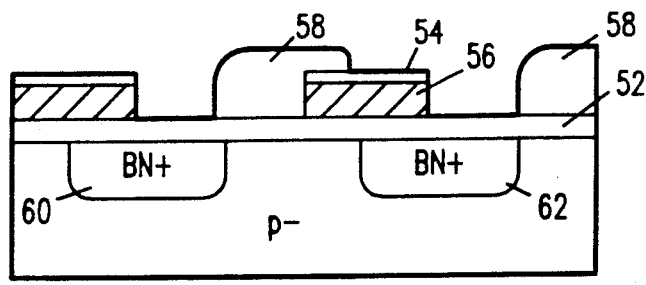
FIGS. 3A-3F are cross-sectional views illustrating the steps of a stacked etch fabrication process for forming a split-gate EPROM cell in accordance with the present invention.

FIGS. 3A-3E illustrate an integrated circuit fabrication process that utilizes a stacked etch to form a split-gate EPROM cell. Referring to FIG. 3A, in accordance with the process, a first polysilicon layer is deposited on a gate oxide layer 52 formed on a P— silicon substrate in the conventional manner. Following deposition of an oxide-nitride-oxide (ONO) layer 54, the ONO/polysilicon/gate oxide structure is patterned and etched in the conventional manner to define a polysilicon floating gate 56. A layer of photoresist is then formed and etched to serve as a mask 58 for the implant formation of buried N+ source region 60, an edge of the floating gate 56 serving as the self-aligned mask for an edge of the buried N+ drain region 62.

Figure 3B:
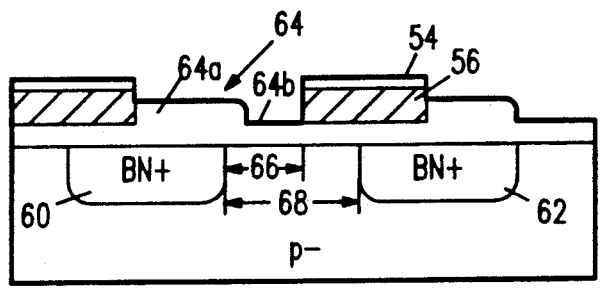

Referring to FIG. 3B, the photoresist mask 58 is then stripped and, in accordance with the present invention a low temperature steam oxidation at 800° C. is performed to create a differential oxide layer 64 overlying exposed portions of the buried N+ regions and the exposed portion 66 of the channel region 68 between the buried N+ region and the floating gate 56. For example, growth of a 1000Å oxide layer 64a on the exposed portion of the buried N+ region will result in the growth of a 250Å oxide layer 64b on the exposed secton 66 of the channel region between the source region 60 and the floating gate 56.

The process then proceeds with the performance of a conventional stacked etch. That is, a second layer of polysilicon is deposited and doped. The second polysilicon layer is then masked and etched to define the polysilicon control gate lines 70 of the split-gate cell. Following a DUV hardening, the etched polysilicon control lines are used as a self-aligned etch mask to etch the underlying ONO layer and, subsequently, the underlying first layer of floating gate polysilicon 56.

Figure 3C:
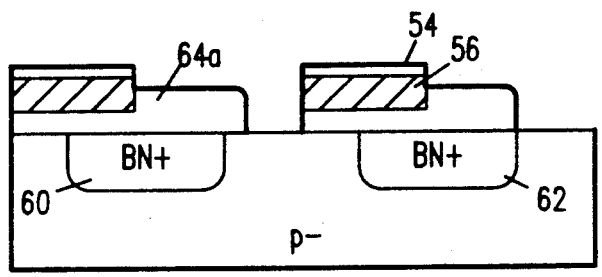
Figure 3D:
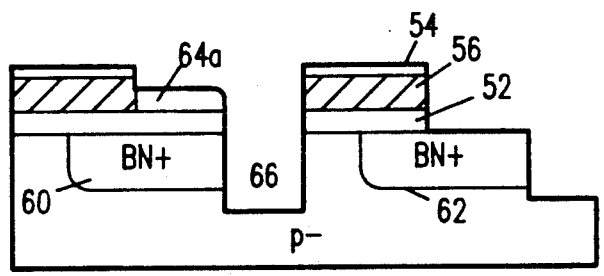
Figure 3E:
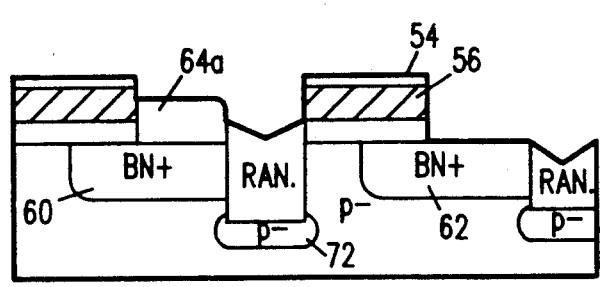
Figure 3F:
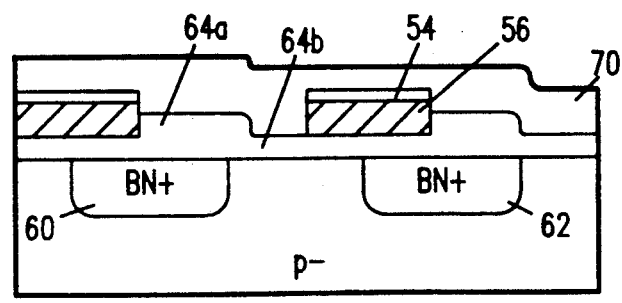

These steps result in the formation of split-gate cells of the type shown in FIG. 3F.

Figure 1A:
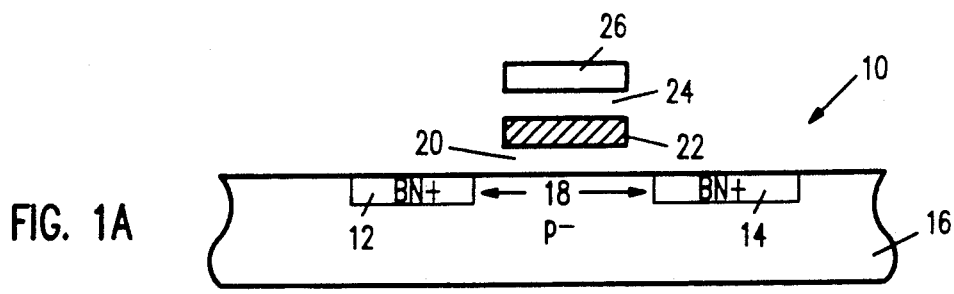
FIG. 1A is a cross-sectional view illustrating a conventional stacked gate EPROM cell.
Figure 1B:
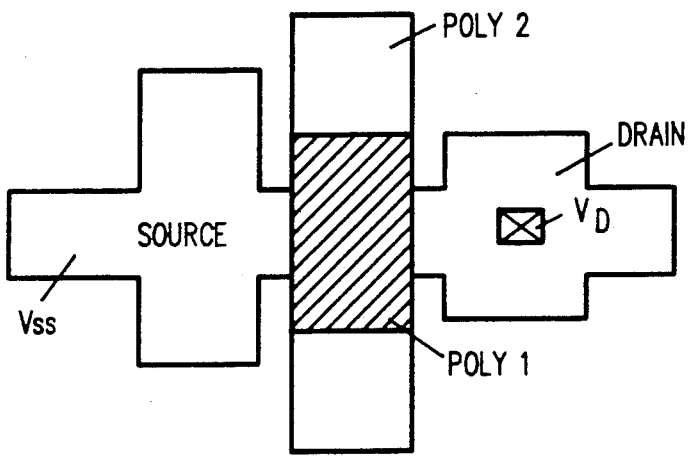
FIG. 1B is a plan view illustrating the FIG. 1A stacked gate EPROM cell.
Figure 2A:
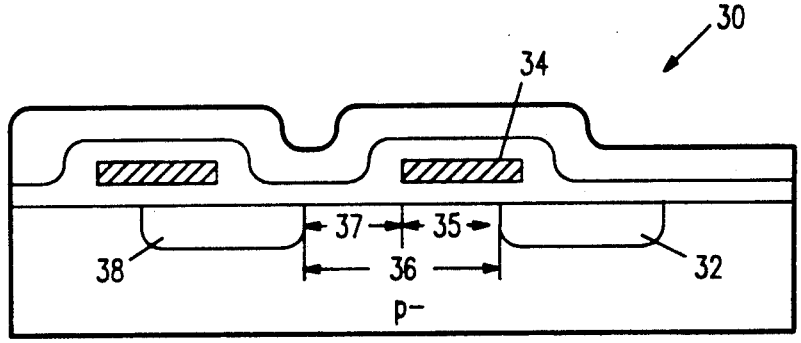
FIG. 2A is a cross-sectional view illustrating a conventional split-gate EPROM cell.
Figure 2B:
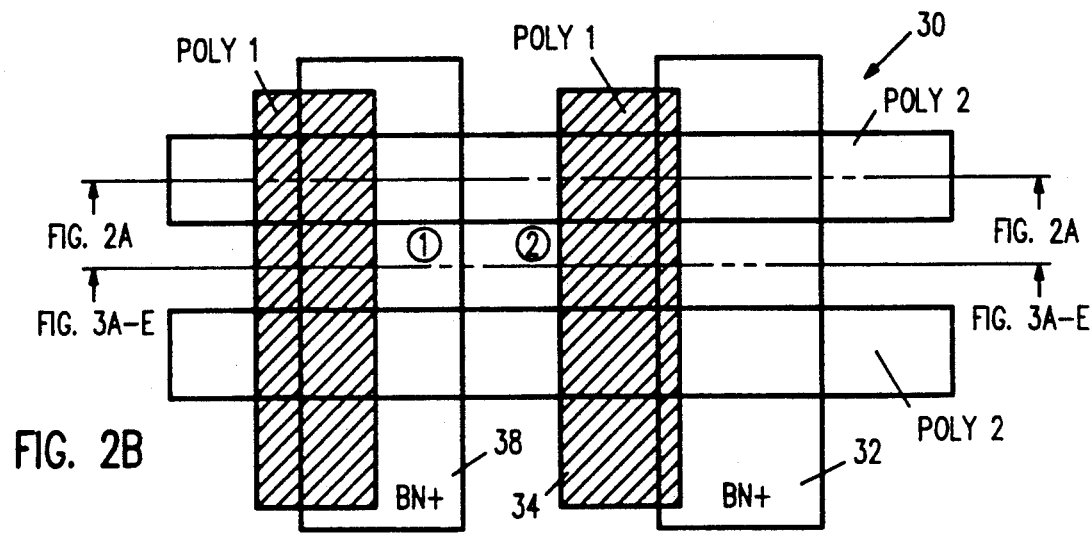
FIG. 2B is a plan view illustrating the FIG. 2A split-gate EPROM cell.

Referring to the FIGS. 3C and 3D cross-sectional views, which are taken between adjacent control gate lines 70 (comparable to a cross-section) along line 3A-E in FIG. 2B), in accordance with the present invention, because the above-described process forms a differential oxide layer in the region between adjacent control gate lines 70 (i.e. regions (1) and (2) in FIG. 2B), the polysilicon floating gate 56 may be overetched during the stacked etch steps, thereby thinning the oxide overlying the buried N+ regions somewhat, as shown in FIG. 30, without digging into the N+ regions, but while digging into the P— substrate regions 64b to below the junction depth of the buried N+ regions 60,62. This results in the formation of a trench 66 between the adjacent N+ regions in the area between adjacent control lines.

As shown in FIG. 3E, after this stacked etch, a region 72 P-isolation boron is implanted. Then the trench 66 in the P— substrate is filled by planarization (LPCVD TEOs deposit and etch-back) in order to assure good step coverage for the subsequent metallization.

As a result of the foregoing process, bit line to bit line reach-through is prevented by the trenching in the P— silicon between adjacent N+ regions. Furthermore, bit line interruption is prevented by the use of the differential oxidation step to protect the buried N+ regions during the stacked etch.

It should be understood that various alternatives to the embodiments of the invention described herein may be employed in practicing the invention. It is intended that following claims define the scope of the invention and that structures and methods within the scope of these claims and their equivalents be covered thereby.

What is claimed is:

1. A method of fabricating a split-gate memory cell array in a semiconductor substrate of a first conductivity type utilizing stacked etch fabrication techniques, the method comprising the steps of:

(a) forming a layer of first dielectric material on the semiconductor substrate;

(b) forming a layer of first conductive material over the first dielectric material;

(c) forming a layer of second dielectric material over the first conductive material;

(d) etching the layer of second dielectric material and the layer of first conductive material to provide a plurality of spaced-apart and parallel-extending floating gate strips of the first conductive material that are separated from the semiconductor substrate by underlying first dielectric material and have second dielectric material formed thereon;

(e) forming a plurality of dopant regions of a second conductivity type in the semiconductor substrate, adjacent dopant regions being spaced-apart to define a channel region therebetween a first edge of each floating gate strip being used to define an edge of a corresponding dopant region, the floating gate strip extending only over a first section of the channel region defined between the corresponding dopant region and an adjacent dopant region such that a second portion of the channel region is defined between a second edge of the floating gate strip and the adjacent dopant region;

(f) forming a differential oxide layer on the semiconductor substrate between adjacent floating gate strips, the differential oxide layer comprising simultaneously formed first and second oxide regions, the first oxide region formed over exposed portions of the dopant region and having a first thickness and the second oxide region formed over the second section of the channel region and having a second thickness which is less than the first thickness;

(g) forming a layer of second conductive material over the differential oxide layer and over the plurality of floating gate strips such that the floating gate strips are separated from the second conductive material by the second dielectric material;

(h) etching the layer of second conductive material to define a plurality of parallel control gate lines that extend perpendicular to the floating gate strips;

(i) utilizing the control gate lines as a self-aligned mask in a stacked-etch step to etch the underlying second dielectric material and, subsequently, the underlying floating gate strips to define spaced-apart and parallel-extending floating gates of the split-gate memory cell array whereby, during the stacked-etch step, the first oxide region of the differential oxide layer protects the surface of the dopant region and the second oxide region of the differential oxide layer is overetched into the underlying semiconductor substrate to form a trench in the channel region that extends below the junction depth of the dopant region.

2. A method of fabricating a split-gate memory cell array in a P-type silicon substrate utilizing stacked etch techniques, the method comprising the steps of:

(a) forming a layer of silicon dioxide on the substrate;

(b) forming a first layer of polysilicon over the layer of silicon dioxide;

(c) forming a layer of ONO over the first layer of polysilicon;

(d) etching the ONO layer and the first layer of polysilicon to define a plurality of spaced-apart and parallel-extending polysilicon floating gate strips that are separated from the substrate by underlying silicon dioxide and have ONO formed thereon;

(e) forming a plurality of N+ regions in the substrate, adjacent N+ regions being spaced-apart to define a substrate channel region therebetween, a first edge of each floating gate strip being used to define an edge of a corresponding N+ region, the floating gate strip extending only over a first portion of the channel region defined between the corresponding N+ region and an adjacent N+ region such that a second section of the channel region is defined between a second edge of the floating gate strip and the adjacent N+ region;

(f) forming a differential oxide layer on the substrate between adjacent floating gate strips, the differential oxide layer comprising simultaneously formed first and second oxide regions, the first oxide region formed over exposed portions of the N+ region and having a first thickness and the second oxide region formed over the second section of the channel region and having a second thickness which is less than the first thickness;

(g) forming a second layer of polysilicon over the differential oxide layer and overlying the plurality of floating ate strips such that the floating gate strips are separated from the second layer of polysilicon by the ONO;

(h) etching the second layer of polysilicon to define a plurality of parallel polysilicon control gate lines that extend perpendicular to the floating gate strips; and (i) utilizing the polysilicon control gate lines as a self-aligned mask in a stacked-etch step to etch the underlying ONO and, subsequently, the underlying polysilicon floating gate strips to define spaced-apart and parallel-extending polysilicon floating gates of the split-gate memory cell array whereby, during the stacked-etch step, the first oxide region of the differential oxide layer protects the surface of the N+ regions and the second oxide region of the differential oxide layer is overetched into the underlying P-type substrate to form a trench in the channel region that extends below the junction depth of the N+ regions.

3. A method as in claim 2 and including the further step of forming a p− isolation region in the bottom of the trench.

4. A method as in claim 2 and including the further step of filling the trench.

5. A method as in claim 2 and including the further steps of forming a p− isolation region in the bottom of the trench and filling the trench.

* * * * *

UNITED STATES PATENT AND TRADEMARK OFFICE
CERTIFICATE OF CORRECTION

PATENT NO. : 5,091,327

DATED : February 25, 1992

INVENTOR(S) : Albert M. Bergemont

It is certified that error appears in the above - identified patent and that said Letters Patent is hereby corrected as shown below:

In Col. 6 line 16 the word "ate" should be --gate--.

Signed and Sealed this

Twenty-ninth Day of June, 1993

Attest:

MICHAEL K. KIRK

Attesting Officer

Acting Commissioner of Patents and Trademarks